United States Patent
Lin et al.

(10) Patent No.: US 8,803,809 B2
(45) Date of Patent: Aug. 12, 2014

(54) OPTICAL TOUCH DEVICE AND KEYBOARD THEREOF

(71) Applicant: Quanta Computer Inc., Tao Yuan Shien (TW)

(72) Inventors: Chien-Ta Lin, Huatan Township, Changhua County (TW); Wen-Ji Tsai, Sinjhuang (TW); Jung-Wen Chang, Lujhu Township, Taoyuan County (TW); Chee-Chun Leung, Tao Yuan Shien (TW)

(73) Assignee: Quanta Computer Inc., Kuei Shan Hsiang, Tao Yuan Shien (TW)

( * ) Notice: Subject to any disclaimer, the term of this patent is extended or adjusted under 35 U.S.C. 154(b) by 111 days.

(21) Appl. No.: 13/734,078

(22) Filed: Jan. 4, 2013

(65) Prior Publication Data

US 2013/0120275 A1    May 16, 2013

Related U.S. Application Data

(62) Division of application No. 12/512,179, filed on Jul. 30, 2009, now Pat. No. 8,368,652.

(30) Foreign Application Priority Data

Apr. 6, 2009 (TW) ................. 98111353 A

(51) Int. Cl.
   *G06F 3/02* (2006.01)
   *G09G 5/00* (2006.01)
   *H03K 17/969* (2006.01)
   *G06F 3/042* (2006.01)

(52) U.S. Cl.
   CPC ............... *G06F 3/02* (2013.01); *H03K 17/969* (2013.01); *G06F 3/0202* (2013.01); *G06F 3/0428* (2013.01)
   USPC ............ 345/168; 345/170; 345/175; 341/21; 200/310; 400/472

(58) Field of Classification Search
   CPC ... G06F 3/0202; G06F 3/0219; G06F 3/0213; G06F 3/0421; G06F 3/0412; G06F 3/042; H04M 1/22; G06K 15/02
   USPC ............ 345/156–158, 168–180; 341/21–23; 200/310, 313, 314, 341; 400/472, 490
   See application file for complete search history.

(56) References Cited

U.S. PATENT DOCUMENTS 5,339,096 A * 8/1994 Beaufort et al. ............... 345/156
5,574,481 A * 11/1996 Lee ................................. 345/168

(Continued)

FOREIGN PATENT DOCUMENTS

CN        87 2 15026       11/1988
CN        201145890        11/2008

OTHER PUBLICATIONS

Chinese language office action dated Jun. 24, 2011.

(Continued)

*Primary Examiner* — Kimnhung Nguyen
(74) *Attorney, Agent, or Firm* — McClure, Qualey & Rodack, LLP

(57) ABSTRACT

The invention provides an optical touch device, including a main body, a keyboard and a light emitting member. The keyboard, placed on the main body and having a first end portion and a second end portion, includes a supporting frame, a keycap and a stopping member. The keycap is connected to the supporting frame and moves between a first position and a second position. The stopping member is connected to the keycap and moves simultaneously with the keycap. The light emitting member generates a light beam to the keyboard. When the keycap is in the first position, the light beam passes through the first end portion to the second end portion, and when the keycap is in the second position, the light beam is terminated by the stopping member, such that the light does not reach the second end portion.

8 Claims, 4 Drawing Sheets

(56) References Cited

U.S. PATENT DOCUMENTS

| | | | |
|---|---|---|---|
| 5,812,116 A * | 9/1998 | Malhi | 345/168 |
| 6,784,870 B2 | 8/2004 | Yin | |
| 7,936,335 B2 | 5/2011 | Uotani | |
| 8,128,297 B2 * | 3/2012 | Chou | 400/472 |
| 8,292,444 B2 * | 10/2012 | Lin et al. | 362/23 |
| 2002/0114153 A1 * | 8/2002 | Chan et al. | 362/85 |
| 2007/0013651 A1 | 1/2007 | Depue et al. | |
| 2007/0246336 A1 | 10/2007 | Heath et al. | |
| 2007/0268261 A1 | 11/2007 | Lipson | |
| 2008/0129697 A1 | 6/2008 | Knighton | |
| 2008/0212307 A1 * | 9/2008 | Chan et al. | 362/85 |
| 2009/0091478 A1 * | 4/2009 | Chan et al. | 341/22 |
| 2009/0146848 A1 | 6/2009 | Ghassabian | |
| 2009/0167722 A1 * | 7/2009 | Villain | 345/174 |
| 2009/0179861 A1 * | 7/2009 | Skillman et al. | 345/168 |

OTHER PUBLICATIONS

Chinese language office action dated May 28, 2012.

\* cited by examiner

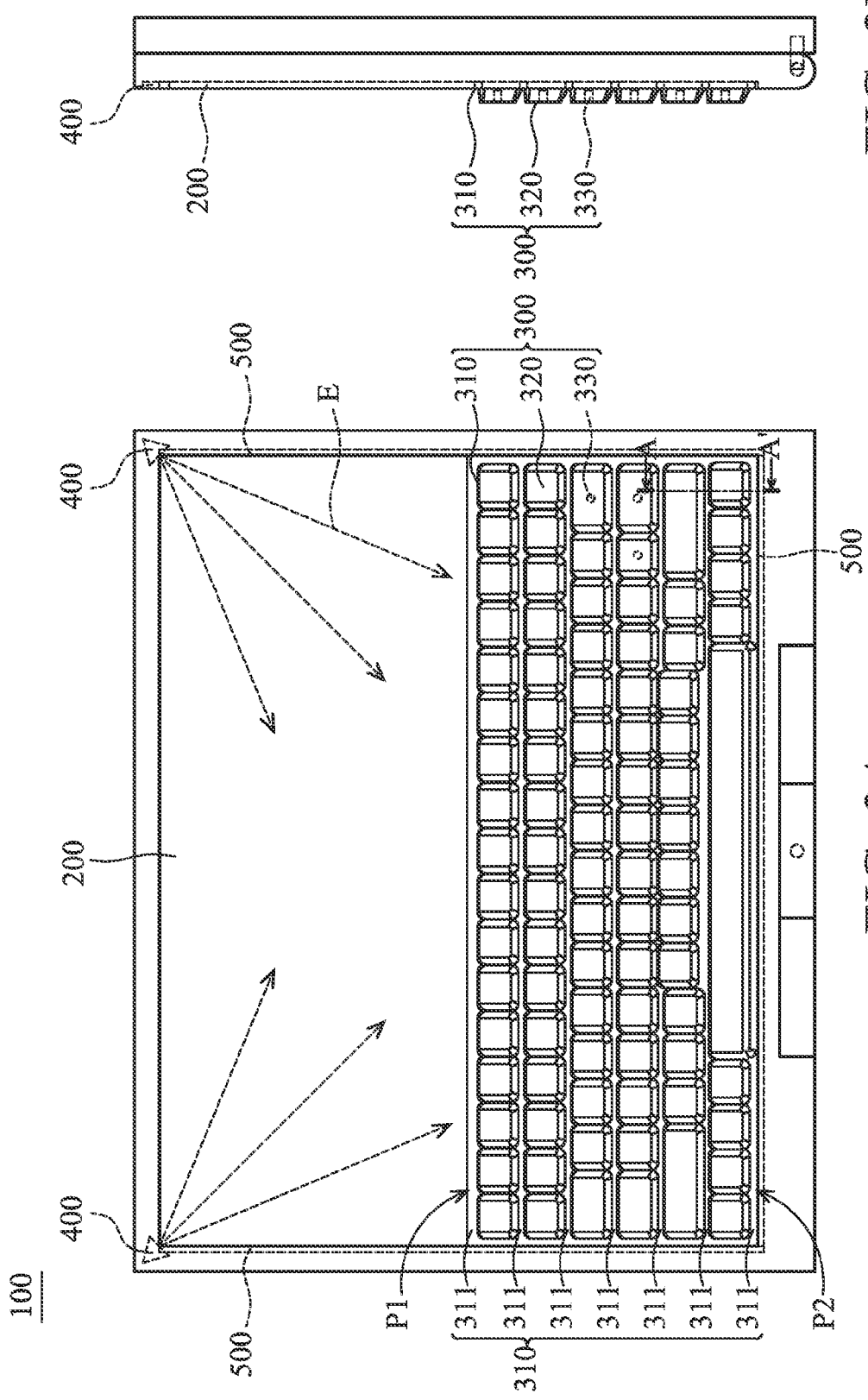

OPTICAL TOUCH DEVICE AND KEYBOARD THEREOF

This application is a Divisional of pending U.S. patent application Ser. No. 12/512,179, filed Jul. 30, 2009, and entitled "Optical Touch Device and Keyboard Thereof," which claims priority of Taiwan Patent Application No. 098111353, filed on Apr. 6, 2009, the entirety of which is incorporated by reference herein.

BACKGROUND OF THE INVENTION

1. Field of the Invention

The invention relates to a keyboard, and in particular, to a keyboard applied for an optical touch device.

2. Description of the Related Art

Keyboards are important for computer systems as an input tool. Usually, keyboards are manufactured by multiple components, such as plastic keypads, tact switches, circuit board and so on, resulting in a complicated structure with fixed costs. Thus, one method to further decrease keyboard costs is to simplify its structure and decrease required components.

A virtual keyboard has been disclosed, utilizing a touch panel. A user directly touches the panel to operate the virtual keyboard. However, a drawback of the virtual keyboard includes users being unable to feel the physical keys of the virtual keyboard so that viewing for position is required for input, thus reducing input speed and causing eyestrain.

BRIEF SUMMARY OF THE INVENTION

The invention provides a keyboard comprising a supporting frame, a keycap and a stopping member. The supporting frame is pervious to light. The keycap is connected to the supporting frame. The stopping member is connected to the keycap and is not pervious to light or opaque. The keycap moves between a first position and a second position. When the keycap is in the first position, the stopping member and the supporting frame are on different horizontals, and when the keycap is in the second position, the stopping member and the supporting frame are on the same horizontal.

The invention provides another keyboard having a first end portion and a second end portion. The keyboard comprises a supporting frame, a keycap and a stopping member. The supporting frame is pervious to light. The keycap is connected to the supporting frame and moves between a first position and a second position. The stopping member is connected to the keycap and is not pervious to light or opaque. When the keycap is in the first position, a light beam passes through the first end portion to the supporting frame to the second end portion, and when the keycap is in the second position, the light beam is terminated by the stopping member, such that the light beam does not reach the second end portion.

The invention provides an optical touch device, comprising a main body, a keyboard and a light emitting member. The keyboard, placed on the main body and having a first end portion and a second end portion, comprises a supporting frame, a keycap and a stopping member. The keycap is connected to the supporting frame and moves between a first position and a second position. The stopping member is connected to the keycap and moves simultaneously with the keycap. The light emitting member generates a light beam to the keyboard. When the keycap is in the first position, the light beam passes through the first end portion to the second end portion, and when the keycap is in the second position, the light beam is terminated by the stopping member, such that the light does not reach the second end portion.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 2A is a plan view of the optical touch device of the invention;

FIG. 2B is an elevational view of the optical touch device in FIG. 2A;

DETAILED DESCRIPTION OF THE INVENTION

Figure 1:
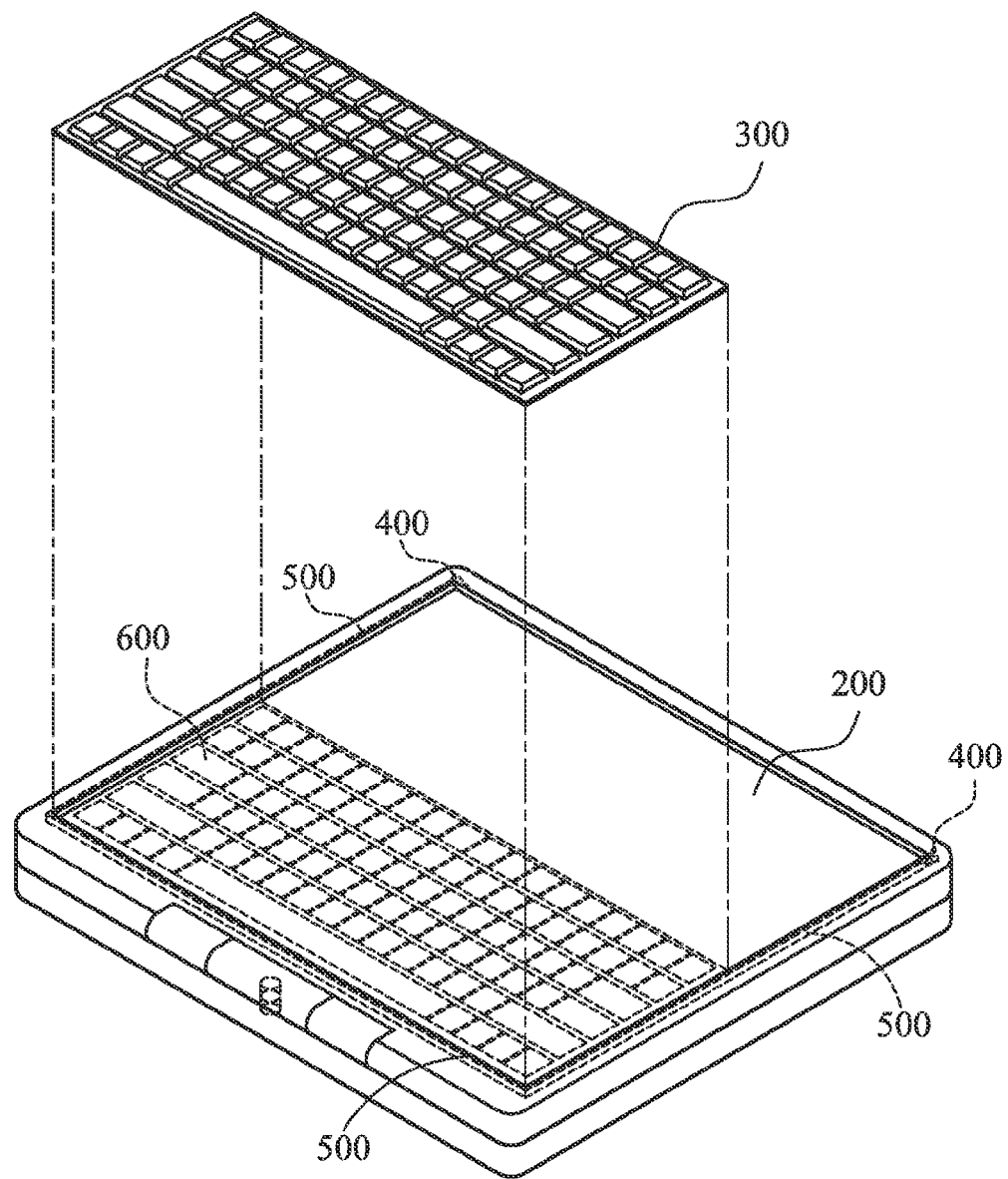
FIG. 1 is an exploded view of an optical touch device of the invention.

As shown in FIG. 1, the invention provides an optical touch device 100 comprising an optical touch panel 200, a keyboard 300, a reflective strip 500 (or a reflector) and two optical lens modules 400 respectively disposed on two adjacent points of the optical touch panel 200. The optical lens module 400 comprises a light emitting member and a light sensor. The optical touch device 100 utilizes the light emitting member of the optical lens module 400 to emit a light beam E and detect the reflected light beam E when the light beam E reaches the reflective strip 500 and is reflected therefrom along its original path. Therefore, when an object or a finger touches a position on a surface of the optical touch panel 200, the light sensor detects a signal of which the light beam is shown to be blocked. Thereby, the touched position on the optical touch panel 200 then can be determined by a processing system according to the blocked point.

Referring to FIG. 2A and FIG. 2B, the keyboard 300 comprises a supporting frame 310, a plurality of keycaps 320 and a plurality of stopping member 330, wherein the supporting frame 310, the keycaps 320 and the stopping member 330 are integrally formed by rubber.

The supporting frame 310 is pervious to light, such that the light beam E from the light emitting member is able to pass through the keyboard 300 to the reflective strip 500, and then is reflected back to the optical sensor. The supporting frame 310 comprises a plurality of supporting members 311 (pervious to light) and the plurality of keycaps 320 are connected to the supporting members 311. Moreover, when the keyboard 300 is placed on the optical touch panel 200, the supporting members 311 abut the optical touch panel 200 thus support the keycap 320, and thereby a distance is kept between the keycaps 320 and the optical touch panel 200.

It should be noted that in the embodiment, the plurality of supporting members 311 are rectangular in shape and arranged in parallel with each other, but the shape and the arrangement of the supporting members 311 are not limited thereto, wherein the keycaps 320 are only required to be supported thereby.

Figure 3A:
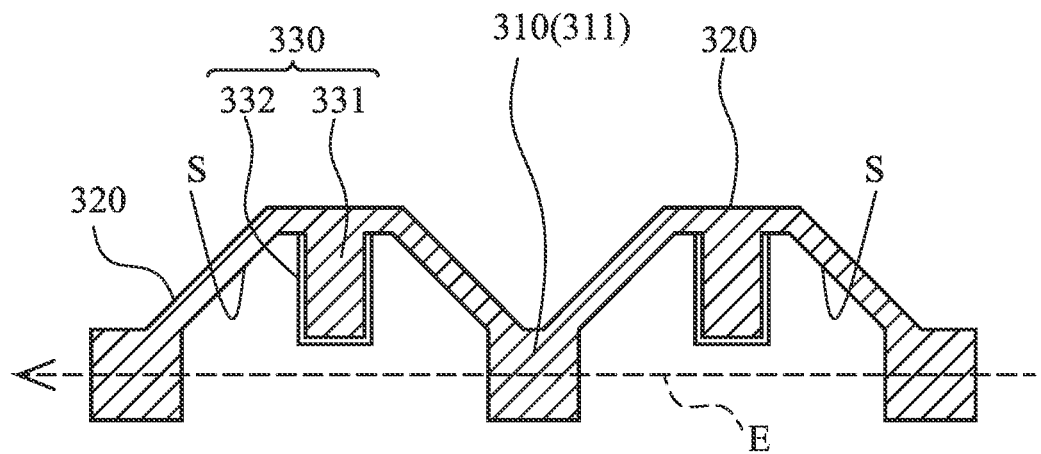
FIGS. 3A and 3B are sectional views along a line A-A' in FIG. 2A.
Figure 3B:
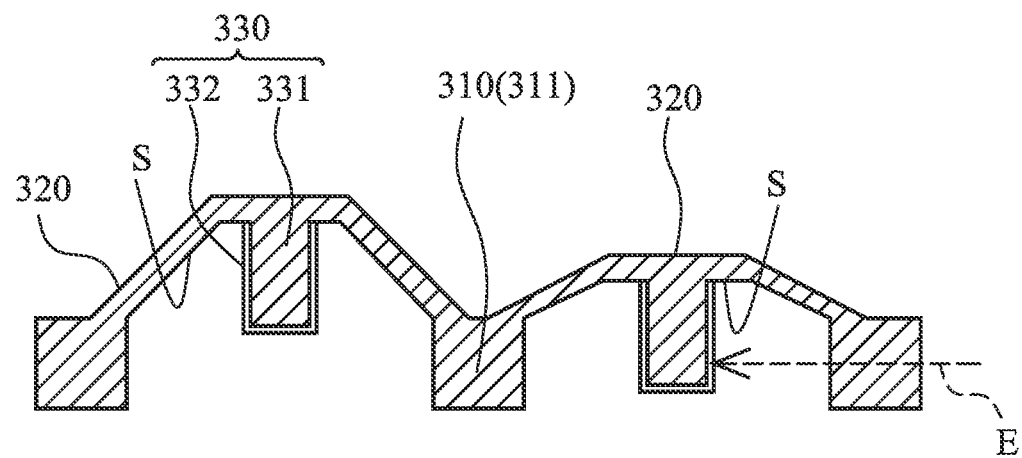

Referring to FIG. 3A and FIG. 3B, the keycap 320 is able to moves between a first position (position before being pressed, as shown in FIG. 3A) and a second position (position after being pressed, as shown in FIG. 3B). Each keycap 320 has an inner surface S. Each keycap 320 is provided a stopping member 330 which moves simultaneously with the keycap 320. The stopping member 330 comprises a protrusion 331 and a layer 332. The protrusion 331, protruded from the inner surface S, is integrally formed with the keycap 320 as a single piece. The layer 332 is formed on the protrusion 331 and is not pervious to light (opaque), or may absorb light to block the light beam. In an embodiment, the layer 332 is a grinding layer, which is formed integrally on the keycap 320 by grinding the inner surface S in order to be not pervious to light. Otherwise, a coating layer or a sputtering layer is formed on the inner surface S to make the layer 322 not pervious to light. Note that the method of forming a layer not pervious to light is not limited thereto, and only requires that the layer 332 is not pervious to light. In an embodiment, the whole stopping member 330 (the protrusion 331 and the layer 332) is made of material not pervious to light, and then is adhered on the inner surface S of the keycap 320. In another embodiment, the protrusion 331 of the stopping member 330 is integrally formed with the keycap 320, and then the layer 332 of the stopping member 330, made of opaque material (not pervious to light), is adhered on the inner surface S of the keycap 320.

Figure 4A:
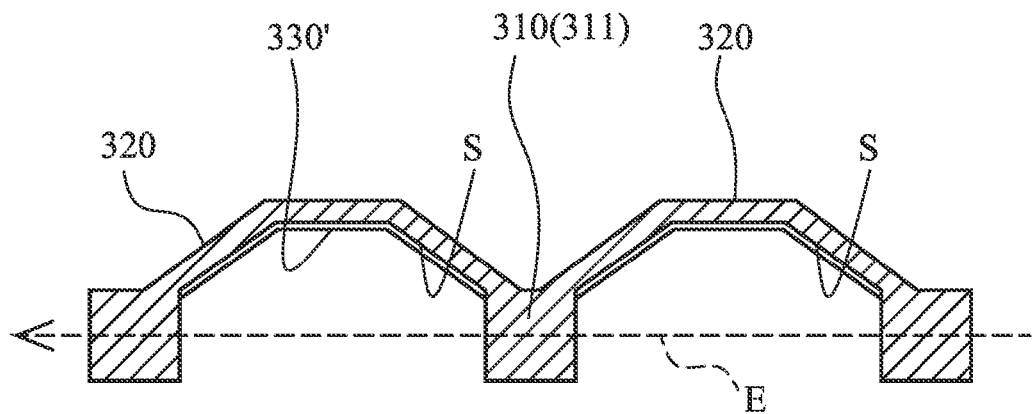
FIGS. 4A and 4B are sectional views showing variant embodiments of the keycap in FIGS. 3A and 3B.
Figure 4B:
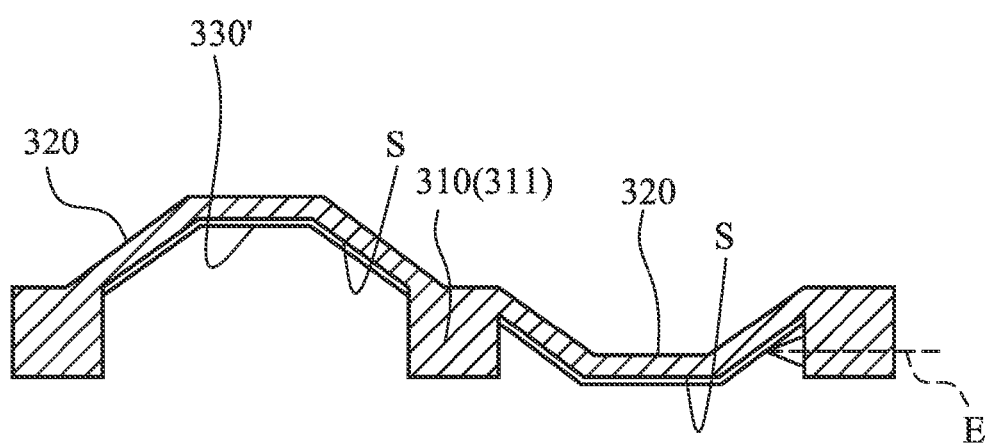

Referring to FIGS. 4A and 4B, in a variant embodiment, the keycap 320 is able to move between a first position (position before being pressed, as shown in FIG. 4A) and a second position (position after being pressed, as shown in FIG. 4B), wherein the stopping member 330' is a layer directly formed on the inner surface S of the keycap 320. Specifically, the layer 330' is a grinding layer, which is formed integrally on the keycap 320 by grinding the inner surface S. Otherwise, a coating layer or a sputtering layer is formed on the inner surface S, but it is not limited thereto as long as the inner surface S is not pervious to light or opaque.

Referring to FIGS. 3A and 4A, when the keycap 320 is in the first position (position before being pressed), the bottom of the stopping member 330, 330' and that of the supporting frame 310 are at different horizontals. Referring to FIGS. 3B and 4B, when the keycap 320 is pressed down to move from the first position to the second position (position after being pressed), the bottom of stopping member 330, 330' and that of the supporting frame 310 are at the same horizontal.

Referring to FIGS. 2A, 2B, 3A, 3B, 4A and 4B again, as shown in FIG. 2A, the keyboard 300, placed on the optical touch panel 200, has a first end portion P1 and a second end portion P2 opposite thereto. The optical lens module 400 is disposed on the two adjacent corners of the optical touch panel 200, and provides a light beam E to detect whether there are fingers or objects touching the surface of the optical touch panel 200. As shown in FIGS. 3A and 4A, when the keycap 320 is in the first position, the light beam E successfully passes through the supporting members 311, from the first end portion P1 to the second end portion P2, to reach the reflective strip 500 because the supporting frame 310 and the supporting members 311 are pervious to light. As shown in FIGS. 3B and 4B, when the user presses the keycap 320 from the first position to the second position, allowing the stopping member 330, 330' and the supporting frame 310 to be on the same horizontal, the light beam E is stopped by the stopping member 330, 330' which is not pervious to light, such that the light beam E is not able to pass through the stopping member 330, 330 to reach the second end portion P2 and the reflective strip 500 as well. Meanwhile, a blocked point would be detected and used to obtain the location of the pressed down keycap 320.

As described, before the user presses down the keycap 320, the light beam E successfully passes through the keyboard 300 to reach the reflective strip 500 and be reflected thereby. The situation is like that there is not any contact point on the conventional optical touch panel. After the user presses down the keycap 320, due to the stopping ability of the stopping member 330, 330', the light beam E can not reach the reflective strip 500. Therefore, a blocked point is detected by the optical sensor, and this situation is like that there is a contact point on the conventional optical touch panel.

Referring to FIG. 1, in an embodiment, a virtual keyboard 600 can be display in the optical touch panel 200. When the keyboard 300 is placed on the optical touch panel 200, the keyboard 300 corresponds to the virtual keyboard 600. That is, the keycaps 320 of the keyboard 300 corresponds to the keys of the virtual keyboard 600, respectively. As a result, after the user presses down a specific keycap, the corresponding key of the virtual keyboard 600 is touched, and a corresponding function is performed. In an embodiment, no virtual keyboard is displayed in the optical touch panel 200, but location data of the contact points for each keycaps 320 on the optical touch panel is pre-determined and stored (i.e. locations of the blocked points). For example, when a specific keycap is pressed down, the specific keycap may be determined according to the location of a blocked point corresponding to the specific keycap, and the function of the pressed keycap may be performed.

The keyboard 300 of the invention can be applied in any optical touch device. When a user needs to use a physical keyboard, the keyboard 300 can be placed on the optical touch panel to be operated, providing real touch feeling without affecting the operation of the optical touch device. Additionally, the keyboard 300 is formed integrally by soft material, thus the keyboard 300 can be folded in any manner, which is convenient for users to carry. Moreover, the keyboard 300 has a simple structure and low material cost.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A keyboard, comprising:
a supporting frame pervious to light;
a keycap connected to the supporting frame; and
an opaque stopping member connected to the keycap;
wherein the keycap moves between a first position and a second position, and when the keycap is in the first position, the stopping member and the supporting frame are on different horizontals, and when the keycap is in the second position, the stopping member and the supporting frame are on the same horizontal.

2. The keyboard as claimed in claim 1, wherein the supporting frame comprises a plurality of supporting members that are parallel with each other.

3. The keyboard as claimed in claim 1, wherein the keycap has an inner surface, and the stopping member is disposed on the inner surface.

4. The keyboard as claimed in claim 3, wherein the stopping member comprises a protrusion and a layer, the protrusion protrudes from the inner surface, and the layer is formed on the protrusion.

5. The keyboard as claimed in claim 4, wherein the layer comprises a coating layer, a grinding layer or a sputtering layer.

6. The keyboard as claimed in claim 3, wherein the stopping member is a layer formed on the inner surface.

7. The keyboard as claimed in claim 6, wherein the layer comprises a coating layer, a grinding layer or a sputtering layer.

8. A keyboard, having a first end portion and a second end portion, comprising:
- a supporting frame pervious to light;
- a keycap connected to the supporting frame and moving between a first position and a second position; and
- an opaque stopping member connected to the keycap;
- wherein when the keycap is in the first position, a light beam passes through the first end portion to the second end portion, and when the keycap is in the second position, the light beam is terminated by the stopping member, thus the light beam does not reach the second end portion.

* * * * *